(12) United States Patent
Sun et al.

(10) Patent No.: US 10,991,918 B2
(45) Date of Patent: Apr. 27, 2021

(54) METHOD FOR PREPARING DISPLAY PANEL, DISPLAY PANEL AND DISPLAY DEVICE

(71) Applicant: BOE Technology Group Co., Ltd., Beijing (CN)

(72) Inventors: Tao Sun, Beijing (CN); Tao Wang, Beijing (CN); Ziyu Zhang, Beijing (CN)

(73) Assignee: Boe Technology Group Co., Ltd., Beijing (CN)

(*) Notice: Subject to any disclaimer, the term of this patent is extended or adjusted under 35 U.S.C. 154(b) by 0 days.

(21) Appl. No.: 16/523,410

(22) Filed: Jul. 26, 2019

(65) Prior Publication Data
US 2020/0194733 A1    Jun. 18, 2020

(30) Foreign Application Priority Data
Dec. 14, 2018   (CN) .......................... 201811531278.6

(51) Int. Cl.
*H01L 51/56* (2006.01)
*B23K 26/364* (2014.01)
(Continued)

(52) U.S. Cl.
CPC ............ *H01L 51/56* (2013.01); *B23K 26/364* (2015.10); *H01L 27/3244* (2013.01);
(Continued)

(58) Field of Classification Search
CPC .............. H01L 51/56; H01L 2251/566; H01L 2251/56; H01L 27/3297; H01L 51/5253; H01L 51/5237; B23K 26/364
See application file for complete search history.

(56) References Cited

U.S. PATENT DOCUMENTS

| 2009/0103010 A1 | 4/2009 | Okamoto et al. |
| 2013/0037804 A1 | 2/2013 | Lee et al. |

(Continued)

FOREIGN PATENT DOCUMENTS

| CN | 102931207 A | 2/2013 |
| CN | 104821294 A | 8/2015 |

(Continued)

OTHER PUBLICATIONS

Mezhiba et al., Trade-Offs in CMOS VLSI Circuits, C. Toumazou et al. (eds), Trade-Offs in Analog Circuit Design: The Designer's Companion, 75-114, 2002 Kluwer Academic Publishers (Year: 2002).*

*Primary Examiner* — Shih Tsun A Chou
(74) *Attorney, Agent, or Firm* — Muncy, Geissler, Olds & Lowe, P.C.

(57) ABSTRACT

The present disclosure provides a method for preparing a display panel, a display panel and a display device including the same. The method includes: providing a transparent substrate; and preparing a display structure and a protective film layer covering the display structure on the transparent substrate, in which the preparing the display structure includes: forming a pixel unit array and a lead metal layer on the transparent substrate; and forming a laser barrier layer on a surface of the lead metal layer away from the transparent substrate, in which an orthogonal projection of the laser barrier layer on the transparent substrate partially covers that of the lead metal layer on the transparent substrate.

9 Claims, 4 Drawing Sheets

(51) Int. Cl.
 *H01L 27/32* (2006.01)
 *H01L 51/00* (2006.01)
 *H01L 51/52* (2006.01)
(52) U.S. Cl.
 CPC ...... *H01L 51/0097* (2013.01); *H01L 51/5253* (2013.01); *H01L 2251/301* (2013.01); *H01L 2251/5338* (2013.01); *H01L 2251/566* (2013.01)

(56) References Cited

U.S. PATENT DOCUMENTS

| | | | |
|---|---|---|---|
| 2013/0242242 A1* | 9/2013 | Saida | G02F 1/1345 349/113 |
| 2017/0133411 A1 | 5/2017 | Xie et al. | |
| 2017/0194605 A1* | 7/2017 | Kuji | H01L 51/524 |
| 2018/0277573 A1 | 9/2018 | Emori | |
| 2019/0252474 A1 | 8/2019 | Li et al. | |

FOREIGN PATENT DOCUMENTS

| | | |
|---|---|---|
| CN | 105137636 A | 12/2015 |
| CN | 107482045 A | 12/2017 |
| CN | 108292484 A | 7/2018 |
| CN | 108538198 A | 9/2018 |
| CN | 108899346 A | 11/2018 |

* cited by examiner

METHOD FOR PREPARING DISPLAY PANEL, DISPLAY PANEL AND DISPLAY DEVICE

CROSS-REFERENCE TO RELATED APPLICATION

This application claims a priority to Chinese Patent Application No. 201811531278.6 filed on Dec. 14, 2018, the disclosures of which are incorporated in their entirety by reference herein.

TECHNICAL FIELD

The present disclosure relates to the field of display technology, and in particular, to a method for preparing a display panel, a display panel and a display device including the same.

BACKGROUND

At present, in the preparation process of the display panel, a plurality of display panels is usually prepared on a transparent substrate, and protective films are attached on the upper surface and the lower surface of the substrate on which the plurality of display panels is formed, respectively. Then, the entire transparent substrate on which the plurality of display panels is formed is cut by a cutting process, to form a plurality of separate display panels. As for an organic light-emitting diode (OLED) display device, since the transparent substrate of the OLED and the thin film transistor array is usually a flexible substrate made of a plastic material, and the protective film is usually also made of a plastic material, the conventional glass cutting process cannot achieve cutting. Typically, a laser process is used to perform the above cutting steps.

SUMMARY

In one aspect, the present disclosure provides a method for preparing a display panel, including: providing a transparent substrate; and preparing a display structure and a protective film layer covering the display structure on the transparent substrate, in which the preparing the display structure includes: forming a pixel unit array and a lead metal layer on the transparent substrate; and forming a laser barrier layer on a surface of the lead metal layer away from the transparent substrate, in which an orthogonal projection of the laser barrier layer on the transparent substrate partially covers that of the lead metal layer on the transparent substrate.

Optionally, the method for preparing the display panel further includes: laser-cutting the protective film layer at a target position on the protective film layer, such that a slit is formed in the protective film layer at the target position, in which an orthogonal projection of the target position on a plane of the laser barrier layer is located within a range of the laser barrier layer; and separating a portion of the protective film layer from the display structure by the slit, to expose at least a portion of the lead metal layer.

Optionally, the method for preparing the display panel further includes: after the separating the portion of the protective film layer from the display structure by the slit, separating the protective film layer from the display structure completely.

Optionally, a plurality of display structures is prepared on the transparent substrate, and the method further includes: laser-cutting along an edge of each of the plurality of display structures, to obtain a plurality of display panels.

Optionally, the laser-cutting the protective film layer at the target position on the protective film layer includes: outputting a laser beam to a surface of the protective film layer; and moving the laser beam along a target trajectory on a surface of the protective film layer, in which the target position is a position through which the laser beam moves along the target trajectory on the protective film layer.

Optionally, in a direction of a first edge of the lead metal layer, a size of the laser barrier layer is less than or equal to a size of the first edge; and in a direction of a second edge of the lead metal layer, a size of the laser barrier layer is 50 μm to 200 μm.

Optionally, the preparing the display structure further includes: forming a packaging layer on a surface of the pixel unit array away from the transparent substrate.

Optionally, a material of the packaging layer is same as a material of the laser barrier layer.

Optionally, the laser barrier layer includes a laser absorbing material capable of absorbing laser energy or a laser reflective material capable of reflecting laser beam.

Optionally, the laser barrier layer includes at least one selected form a group consisting of amorphous silicon (a-Si), silicon nitride ($SiN_x$, $0<x<1$), silicon oxide ($SiO_x$, $1<x<2$), silicon oxynitride ($SiO_xN_y$, $1<x<2$, $0<y<1$), aluminum oxide ($Al_2O_3$), magnesium oxide (MgO), titanium dioxide ($TiO_2$), and zinc oxide (ZnO).

Optionally, in the preparing the display structure on the transparent substrate, the packaging layer and the laser barrier layer are formed by a single patterning process.

In another aspect, the present disclosure also provides a display panel, including a transparent substrate and a display structure arranged on the transparent substrate, the display structure including a pixel unit array and a lead metal layer, in which a laser barrier layer is arranged on the lead metal layer, and an orthogonal projection of the laser barrier layer on the transparent substrate partially covers that of the lead metal layer on the transparent substrate.

Optionally, in the above display panel, in a direction of a first edge of the lead metal layer, a size of the laser barrier layer is less than or equal to a size of the first edge; and in a direction of a second edge of the lead metal layer, a size of the laser barrier layer is 50 μm to 200 μm.

Optionally, in the above display panel, the display structure further includes a packaging layer on the pixel unit array, and a material of the packaging layer is same as a material of the laser barrier layer.

Optionally, in the above display panel, the laser barrier layer includes a laser absorbing material capable of absorbing laser energy or a laser reflective material capable of reflecting laser beam.

Optionally, in the above display panel, the laser barrier layer includes at least one selected form a group consisting of amorphous silicon (a-Si), silicon nitride ($SiN_x$, $0<x<1$), silicon oxide ($SiO_x$, $1<x<2$), silicon oxynitride ($SiO_xN_y$, $1<x<2$, $0<y<1$), aluminum oxide ($Al_2O_3$), magnesium oxide (MgO), titanium dioxide ($TiO_2$), and zinc oxide (ZnO).

Optionally, in the above display panel, the transparent substrate is made of a flexible material.

DETAILED DESCRIPTION

Figure 1:
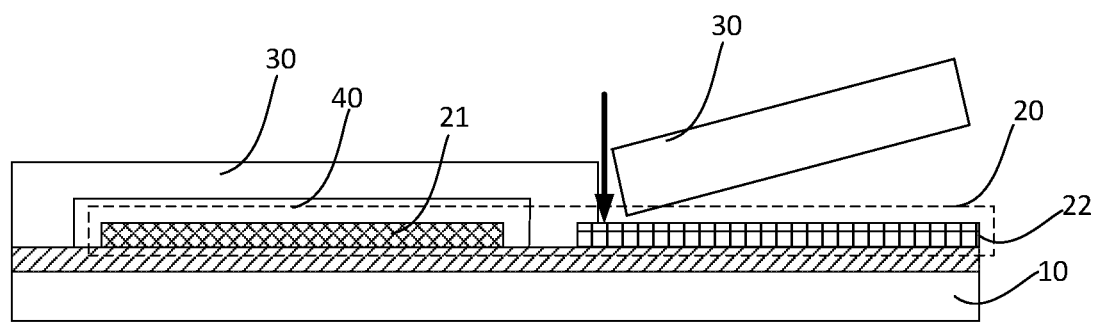
FIG. 1 is a schematic diagram showing the principle of laser half-cutting in a method for preparing a display panel according to an embodiment of the present disclosure.

In order to illustrate the technical problems to be solved, technical solutions and advantages of the present disclosure more clearly, the technical solution of the present disclosure will be further described in conjunction with the following drawings and the detailed description.

Laser cutting is to ablate the film layer to be cut by a laser source of a specific wavelength, to achieve the purpose of cutting. The cutting process in the process of preparing a flexible OLED display device includes a full-cutting process and a half-cutting process. The full cutting is to cut off the film layer of the part to be cut, to achieve the purpose of separation. The half cutting is to cut the film layer of the part to be cut or a part of film material, and remove the cut film material, to facilitate the subsequent testing. The half cutting process requires the adjustment of the laser energy to achieve a suitable depth of cut, without affecting the adjacent fanout regions and lead metal. However, in the actual process operation, a contact film layer in the half-cutting process is very thin, resulting in a very small half-cut process window, and it is easy to damage the underlying metal electrode with a little carelessness. Therefore, the half cutting process increases the difficulty and cost of laser debugging, and the yield of the product is also affected.

An object of the technical solution of the present disclosure is to provide a method for preparing a display panel for solving the problem that when a part of the film material covered on the display panel is cut using a half-cutting process in the preparation of the display panel, the half-cut contact film layer is very thin, which easily damages the underlying metal electrode; and the difficulty and cost of laser debugging are relatively high, and the yield of the product is relatively low. Further, the technical solution of the present disclosure provides a display panel prepared by the above method and a display device including the same, which have improved performance due to the provision of a laser barrier layer.

According to an embodiment of the present disclosure, there is provided a method for preparing a display panel, including: providing a transparent substrate; and preparing a display structure and a protective film layer covering the display structure on the transparent substrate, in which the step of preparing the display structure includes: forming a pixel unit array and a lead metal layer on the transparent substrate; and forming a laser barrier layer on a surface of the lead metal layer away from the transparent substrate, in which an orthogonal projection of the laser barrier layer on the transparent substrate partially covers that of the lead metal layer on the transparent substrate.

The method for preparing the display panel according to an embodiment of the present disclosure may achieve the following advantageous technical effects: a lead metal layer is prepared by arranging a laser barrier layer between a lead metal layer and a protective film layer, such that when the protective film layer above the lead metal layer is subjected to a laser half cutting, the laser cutting is prevented from damaging the underlying metal electrode; and the difficulty and cost of laser debugging in the half-cutting process are reduced, and the time of the half-cutting process is saved.

Figure 2:
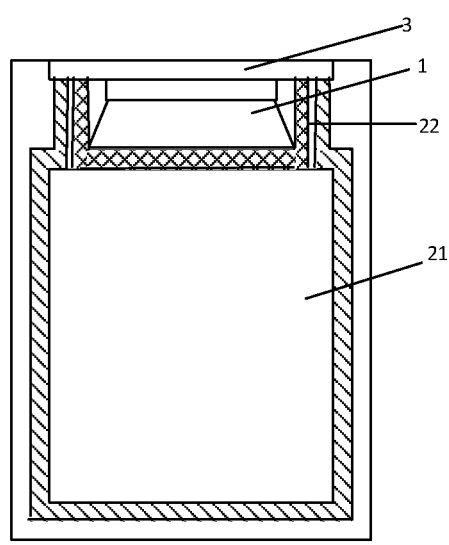
FIG. 2 is a schematic diagram showing a display panel prepared in a method for preparing a display panel according to an embodiment of the present disclosure.

As shown in FIG. 1, in the preparation of the display panel, after the display structure 20 is prepared on the transparent substrate 10, in order to protect the prepared display structure 20, it is necessary to prepare a packaging layer 40 on the display structure 20 and attach a protective film layer. The protective film layer includes a protective film layer 30 covered on the packaging layer 40 and a lower protective layer (not shown in FIG. 1) attached to the surface of the transparent substrate 10 away from the display structure 20. Specifically, in conjunction with FIGS. 1 and 2, in the process of preparing a display panel, the prepared display structure 20 includes a pixel cell array 21 and a lead metal layer 22. The arrangement region of the pixel unit array 21 corresponds to the display region of the display panel, and the lead metal layer 22 is correspondingly arranged in the fanout region 1 at the periphery of the display region, so that the pixel unit array 21 is electrically connected to the pad 3 bound to the edge of the fanout region 1. After attaching the protective film layer 30 on the display structure 20, in order to facilitate subsequent testing, the protective film layer 30 needs to be cut off by a laser half-cutting process, to remove the partial cut film layer. As shown in FIG. 1, it is necessary to ensure that the lead metal layer 22 under the protective film layer 20 cannot be broken in the process of cutting the protective film layer 30, to avoid damaging the metal electrode.

Therefore, the laser half-cutting process in the process for preparing the display panel requires the adjustment of the laser energy to achieve a suitable depth of cut, without affecting the adjacent regions and lead metal layer. In order to avoid the problem that the difficulty and cost of laser debugging are relatively high and the underlying metal electrode is easily damaged due to the half-cut contact film layer being very thin in the half-cutting process, an embodiment of the present disclosure provides the above method for preparing the display panel.

Figure 3:
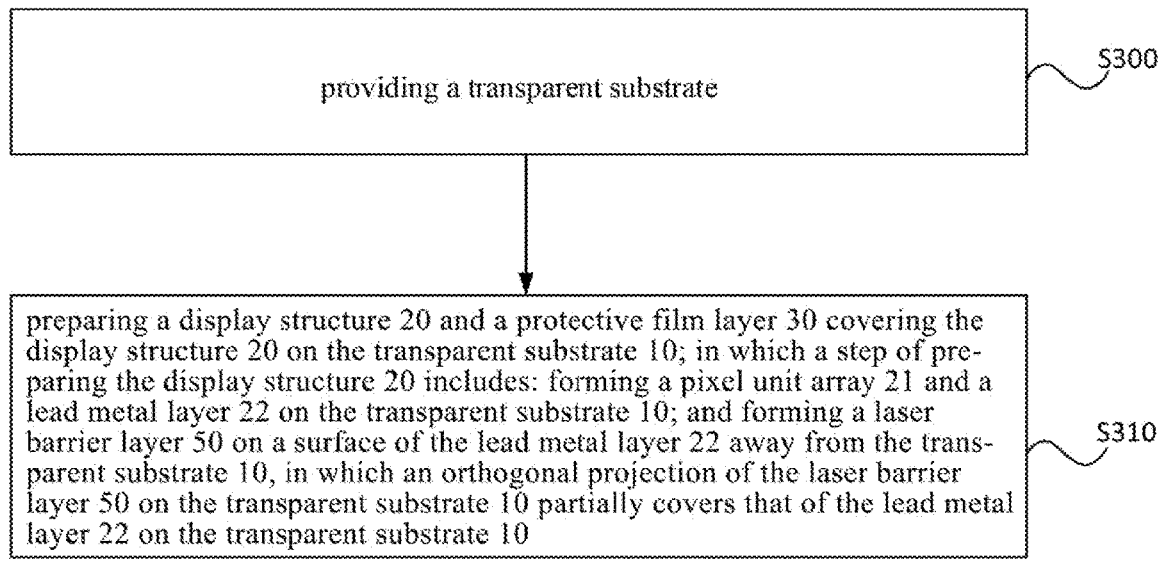
FIG. 3 is a flow chart showing a method for preparing a display panel according to an embodiment of the present disclosure.
Figure 4:
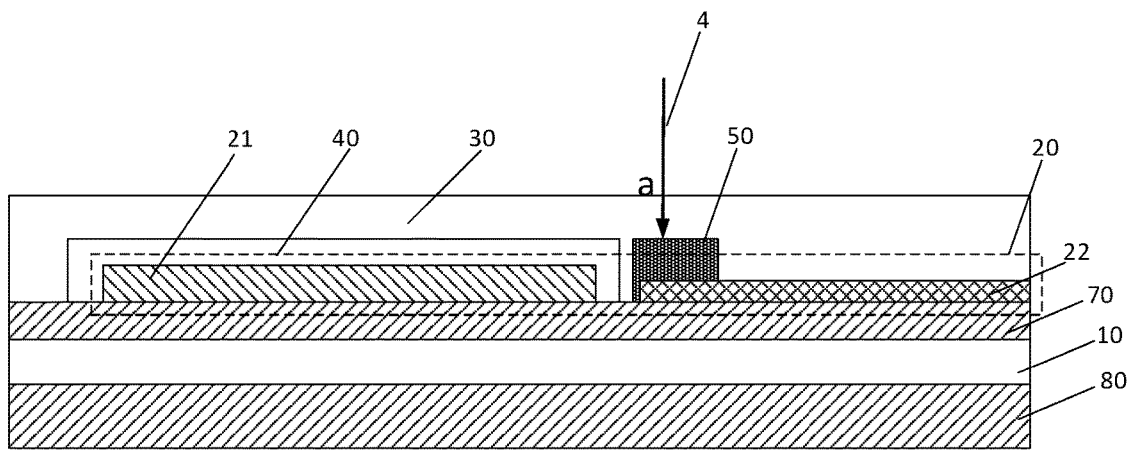
FIG. 4 is a schematic cross-sectional view showing a display panel prepared in a method for preparing a display panel according to an embodiment of the present disclosure.

As shown in FIGS. 3 and 4, the method for preparing the display panel according to an embodiment of the present disclosure includes: S300, providing a transparent substrate; and S310, preparing a display structure 20 and a protective film layer 30 covering the display structure 20 on the transparent substrate 10, in which the preparing the display structure 20 includes: forming a pixel unit array 21 and a lead metal layer 22 on the transparent substrate 10; and forming a laser barrier layer 50 on a surface of the lead metal layer 22 away from the transparent substrate 10, in which an orthogonal projection of the laser barrier layer 50 on the transparent substrate 10 partially covers that of the lead metal layer 22 on the transparent substrate. That is, the laser barrier layer 50 is prepared between the lead metal layer 22 and the protective film layer 30 and located in a partial region above the lead metal layer 22.

In the method for producing the display panel according to an embodiment of the present disclosure, the lead metal layer 22 is protected by the laser barrier layer 50 prepared between the lead metal layer 22 and the protective film layer 30, such that when a laser half cutting is performed on the protective film layer 30 above the lead metal layer 22, the laser cutting is prevented from damaging the underlying metal electrode; and the difficulty and cost of laser debugging in the half-cutting process are reduced, and the time of the half-cutting process is saved.

In the embodiment of the present disclosure, the number the display structure 20 prepared on the transparent substrate 10 may be one or more. Each of the plurality of display structures 20 can be used to form a display panel, and the plurality of display structures 20 can be formed into a plurality of display panels after being separated by cutting. Optionally, the display structure 20 prepared on the transparent substrate 10 is a structural unit having an image display function, and includes a pixel unit array and a lead metal layer connected to the pixel unit array. Optionally, as shown in FIG. 4, in the embodiment of the present disclosure, the pixel unit array 21 includes a thin film transistor array structure and a light emitting layer for forming a display region of the OLED display panel.

Figure 5:
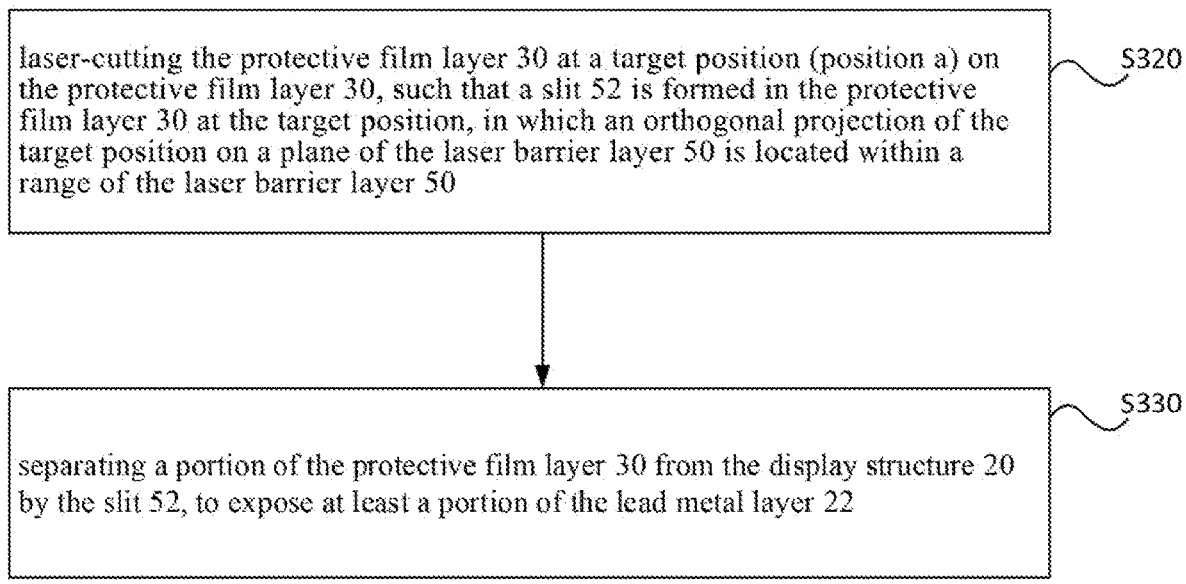
FIG. 5 is a partial flow chart showing a method for preparing a display panel according to an embodiment of the present disclosure.
Figure 8:
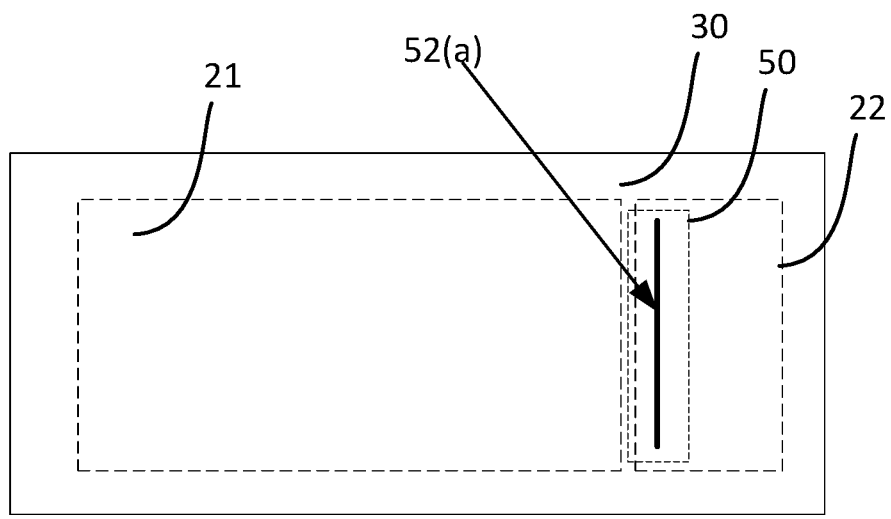
FIG. 8 is a top plan view showing a display panel when half-cutting is performed in a method for preparing a display panel according to an embodiment of the present disclosure.

Optionally, as shown in FIGS. 4, 5 and 8, the method for preparing a display panel of the embodiment of the present disclosure further includes the following steps S320 and S330. Step S320, laser-cutting the protective film layer 30 at a target position (position a) on the protective film layer 30, such that a slit 52 is formed in the protective film layer 30 at the target position, in which an orthogonal projection of the target position on a plane of the laser barrier layer 50 is located within a range of the laser barrier layer 50. S330, separating a portion of the protective film layer 30 from the display structure 20 by the slit 52, to expose at least a portion of the lead metal layer 22

In the above preparation process, when the protective film layer 30 above the lead metal layer 22 is subjected to a laser half cutting, the laser barrier layer 50 prevents the laser cutting from damaging the underlying metal electrode, thereby performing a surface protection on the lead metal layer 22, reducing the difficulty and cost of laser process debugging, and saving process time.

Specifically, in step S310, the laser barrier layer 50 is prepared between the lead metal layer 22 and the protective film layer 30, and is located in a partial region above the lead metal layer 22. The laser barrier layer 50 is made of a laser absorbing material capable of absorbing laser energy, or the laser barrier layer 50 is made of a laser reflective material capable of reflecting laser beam.

As shown in FIG. 4, when the laser barrier layer 50 arranged between the lead metal layer 22 and the protective film layer 30 is made of a laser absorbing material, and the laser beam 4 is incident from the protective film layer 30 above the laser barrier layer 50, the laser absorbing material is capable of absorbing the energy of the laser beam 4 incident to the laser barrier layer 50. This weakens the laser energy, which prevents the lead metal layer 22 from being damaged due to the laser being incident on the lead metal layer 22 through the laser barrier layer 50. When the laser barrier layer 50 arranged between the lead metal layer 22 and the protective film layer 30 is made of a laser reflective material, and the laser beam 4 is incident from the protective film layer 30 above the laser barrier layer 50 to the laser barrier layer 50, the laser reflective material is capable of reflecting the laser beam. This avoids prevents the lead metal layer 22 from being damaged due to the laser being incident on the lead metal layer 22 through the laser barrier layer 50, while the reflected laser beam is reflected back to the protective film layer 30, which can further assist the cutting of the protective film layer 30.

Optionally, in an embodiment of the present disclosure, the laser barrier layer includes at least one selected form a group consisting of amorphous silicon (a-Si), silicon nitride ($SiN_x$, $0<x<1$), silicon oxide ($SiO_x$, $1<x<2$), silicon oxynitride ($SiO_xN_y$, $1<x<2$, $0<y<1$), aluminum oxide ($Al_2O_3$), magnesium oxide (MgO), titanium dioxide ($TiO_2$), and zinc oxide (ZnO).

Figure 6:
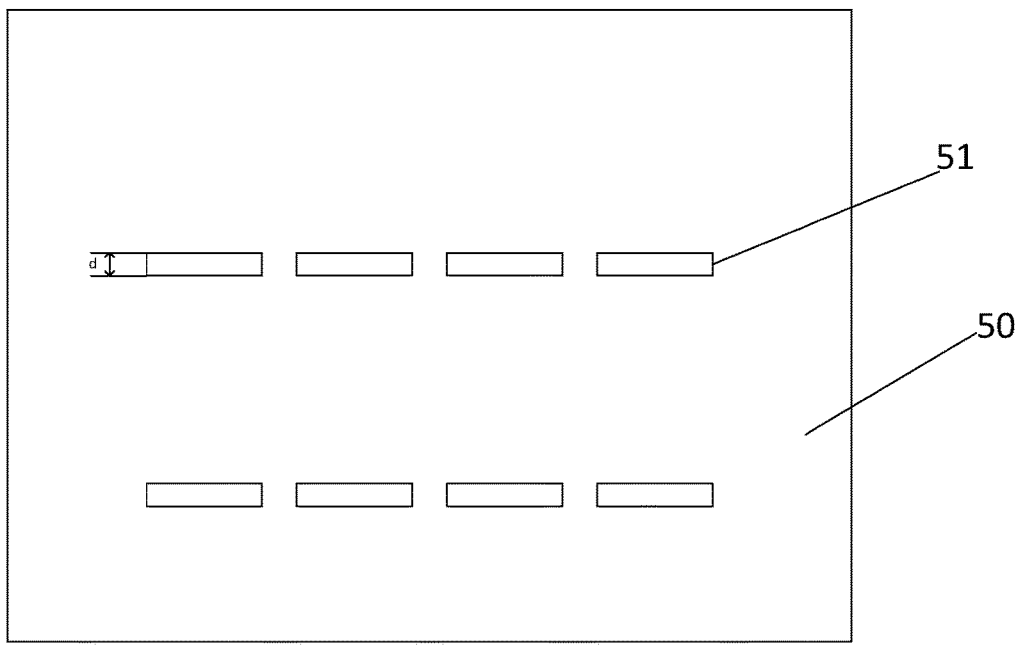
FIG. 6 is a schematic diagram showing an exemplary structure of a mask plate for preparing a laser barrier layer in a method for preparing a display panel according to an embodiment of the present disclosure.

Optionally, in the method for preparing the display panel according to an embodiment of the present disclosure, after the preparation of the lead metal layer 22 is completed, the laser barrier layer 50 can be prepared by the mask plate 5 shown in FIG. 6 by means of one of the following processes: plasma enhanced chemical vapor deposition (PECVD), atomic layer deposition (ALD), and physical vapor deposition (PVD).

Optionally, as shown in FIGS. 4 and 6, the opening 51 on the mask plate 5 is used to deposit a laser barrier layer 50. The opening 51 is arranged along an edge (first edge) of the corresponding lead metal layer 22, and the size of the opening 51 along the edge is less than or equal to the size of the first edge; and in a direction of a second edge of the lead metal layer 22, a size d of the opening 51 is 50 µm to 200 µm. In a direction of a first edge of the lead metal layer, a size of the laser barrier layer 50 formed through the opening 51 is less than or equal to a size of the first edge; and in a direction of a second edge of the lead metal layer 22, a size of the laser barrier layer 50 is 50 µm to 200 µm. Optionally, as shown in FIG. 4, in an embodiment of the present disclosure, the extending direction of the second edge is parallel to the direction from the pixel unit array 21 to the lead metal layer 22, and the first edge is perpendicular to the second edge.

Figure 7:
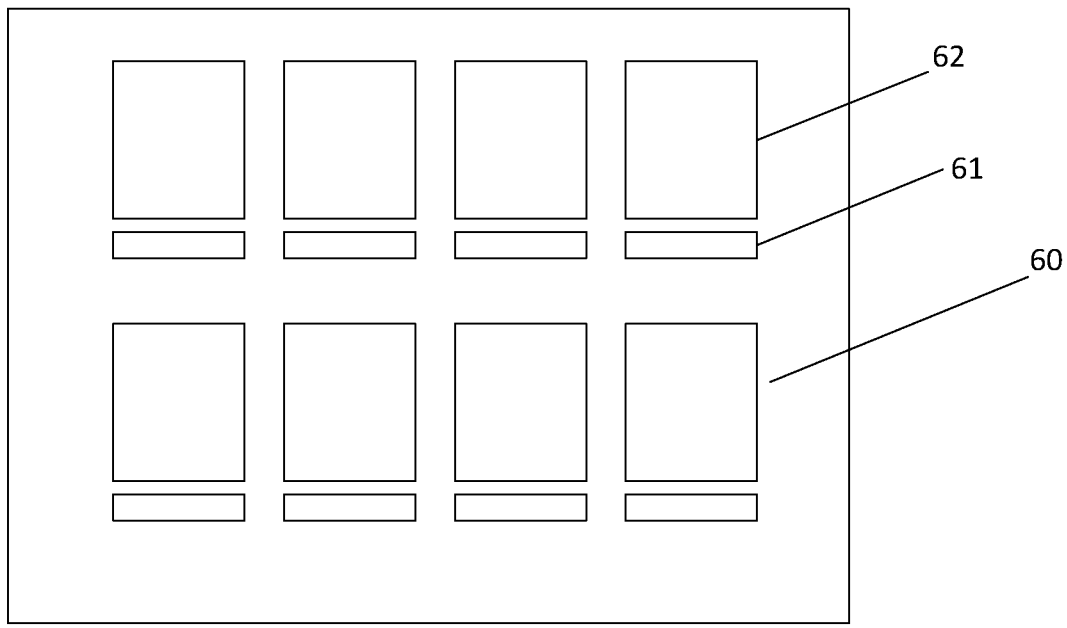
FIG. 7 is a schematic diagram showing another exemplary structure of a mask plate for preparing a laser barrier layer in a method for preparing a display panel according to an embodiment of the present disclosure.

Optionally, as shown in FIGS. 4 and 7, the laser barrier layer 50 and the packaging layer 40 are simultaneously formed in a single patterning process by a single mask plate 6. Optionally, the packaging layer 40 and the laser barrier layer 50 may be formed by means of one of the following processes: plasma enhanced chemical vapor deposition (PECVD), atomic layer deposition (ALD), and physical vapor deposition (PVD).

Specifically, as shown in FIG. 7, the opening 61 on the mask plate 6 is used to deposit a laser barrier layer 50, and the opening 62 on the mask plate 6 is used for deposition to form the packaging layer 40. The size of the opening 61 is the same as the size of the opening 51 in the embodiment of FIG. 6, and this will not be described in detail herein.

Optionally, the transparent substrate 10 of the embodiment of the present disclosure may be made of a flexible material. Optionally, the display panel is a flexible OLED display panel. Optionally, the pixel unit array 21 prepared on the transparent substrate 10 includes a thin film transistor array structure and a light emitting layer.

Specifically, in conjunction with FIGS. 3-8, the method for preparing the display panel according to the embodiment of the present disclosure specifically includes the following steps 1)-8).

1) A polyimide material is coated on a transparent rigid carrier and cured to form a flexible transparent substrate 10.

2) An inorganic layer 70 is prepared on the transparent substrate 10.

3) On the inorganic layer 70, a thin film transistor array structure, an evaporated plated light-emitting layer, and a lead metal layer 22 are prepared, that is, the display structure 20 is prepared.

4) A packaging layer 40 is prepared above the thin film transistor array structure and the evaporated light-emitting layer, in which while the packaging layer 40 is formed, a laser barrier layer 50 is formed on a partial region of the lead metal layer 22 simultaneously in a single patterning process by the mask plate 6 shown in FIG. 7.

Optionally, the packaging layer 40 and the laser barrier layer 50 may also be prepared separately in two separate processes. For example, after the packaging layer 40 is prepared separately, the laser barrier layer 50 may be formed on a partial region of the mask plate 5 on the wiring metal layer 22 as shown in FIG. 5. It can be understood that, in order to simplify the preparation process, when the display panel is prepared, usually a plurality of display panels is formed on one transparent substrate 10 and then cut to form a plurality of separate display panels.

5) A protective film is attached to the packaging layer 40, to prevent the package on the display structure 20 from being damaged outside. Specifically, the protective film includes a protective film layer 30 attached to the thin film transistor array structure and above the evaporated light-emitting layer, and further include a lower protective layer 80 attached to the surface of the transparent substrate 10 away from the display structure 20.

6) The protective film layer 30 is laser-cut at a target position (position a) on the protective film layer 30, such that a slit 52 is formed in the protective film layer 30 at the target position, in which an orthogonal projection of the target position on a plane of the laser barrier layer 50 is located within a range of the laser barrier layer 50.

The laser-cutting the protective film layer 30 at the target position on the protective film layer 30 includes: outputting a laser beam 4 to a surface of the protective film layer 30; and moving the laser beam 4 along a target trajectory on a surface of the protective film layer 30, in which the target position is a position through which the laser beam 4 moves along the target trajectory on the protective film layer 30.

7) The protective film layer 30 of the predetermined region is separated from the display structure by the slit, to expose at least a portion of the lead metal layer 22. In the embodiment of the present disclosure, the trajectory of the laser beam 4 moving on the upper surface of the protective film layer 30 may be a closed pattern for exposing a portion of the lead metal layer 22 for testing when the protective film layer 30 is separated at the slit.

8) The protective film layer 30 outside the preset region is separated from the display structure.

Based on the above steps, after the protective film layer 30 is separated, the display panel and the display panel are cut to separate a plurality of separate display panels.

In an embodiment of the present disclosure, the packaging layer 40 and the laser barrier layer 50 are formed by means of one of the following processes: PECVD, ALD, and PVD. One skilled in the art should understand the specific process of forming the packaging layer 40 and the laser barrier layer 50 by the above processes, and this will not be described in detail herein.

It should be understood that one skilled in the art should understand the specific manner and method for preparing the above thin film transistor array structure, evaporated light-emitting layer and lead metal layer 22, and the preparation process is not the research focus of the present disclosure, which will not be described in detail herein.

By using the method for preparing the display panel of the embodiment of the present disclosure, the laser barrier layer 50 prepared between the lead metal layer 22 and the protective film layer 30 serves to protect the lead metal layer 22 from surface damage, prevent the laser cutting from damaging the underlying metal electrode, reduce the difficulty and cost of laser debugging in the half-cutting process, and save process time.

An embodiment of the present disclosure further provides a display panel, as shown in FIG. 4, including a transparent substrate 10, and a pixel unit array and a lead metal layer 22 arranged on the transparent substrate 10, in which a laser barrier layer 50 is arranged above the lead metal layer 22, and an orthogonal projection of the laser barrier layer 50 on the transparent substrate 10 partially covers that of the lead metal layer 22 on the transparent substrate.

Optionally, the laser barrier layer 50 is made of a laser absorbing material capable of absorbing laser energy, or made of a laser reflective material capable of reflecting laser beam.

Optionally, the laser absorbing material includes at least one selected form a group consisting of amorphous silicon (a-Si), silicon nitride ($SiN_x$, $0<x<1$), silicon oxide ($SiO_x$, $1<x<2$), silicon oxynitride ($SiO_xN_y$, $1<x<2$, $0<y<1$), aluminum oxide ($Al_2O_3$), magnesium oxide (MgO), titanium dioxide ($TiO_2$), and zinc oxide (ZnO).

Optionally, in a direction of a first edge of the lead metal layer, a size of the laser barrier layer 50 formed is less than or equal to a size of the first edge; and in a direction of a second edge of the lead metal layer 22, a size of the laser barrier layer 50 is 50 μm to 200 μm.

Optionally, the display panel further includes a packaging layer 40 located above the pixel unit array. Optionally, the material of the packaging layer 40 is same as the material of the laser barrier layer 50.

Optionally, the transparent substrate is made of a flexible material.

An embodiment of the present disclosure further provides a display device including the display panel of any of the above.

In the display panel and the display device according to an embodiment of the present disclosure, the laser barrier layer 50 arranged between the lead metal layer 22 and the protective film layer 30 serves to protect the lead metal layer 22 from surface damage, prevent the laser cutting from damaging the underlying metal electrode, reduce the difficulty and cost of laser debugging in the half-cutting process, and save process time.

What has been described above is an optional embodiment of the present disclosure. It should be noted that a number of modifications and amendments may be made by one skilled in the art without departing from the spirit and scope of the present disclosure, and such modifications and amendments should also be considered to be within the scope of the present disclosure.

What is claimed is:

1. A method for preparing a display panel, comprising:
   providing a transparent substrate; and
   preparing a display structure and a protective film layer covering the display structure on the transparent substrate,
   wherein the preparing the display structure comprises:
   forming a pixel unit array and a lead metal layer on the transparent substrate; and
   forming a laser barrier layer in direct contact with a surface of the lead metal layer away from the transparent substrate, wherein an orthogonal projection of the laser barrier layer on the transparent substrate partially covers that of the lead metal layer on the transparent substrate,
wherein the laser barrier layer is a single-layer structure made of one material selected from a group consisting of amorphous silicon (a-Si), silicon nitride ($SiN_x$, $0<x<1$), silicon oxide ($SiO_x$, $1<x<2$), silicon oxynitride ($SiO_xN_y$, $1<x<2$, $0<y<1$), aluminum oxide ($Al_2O_3$), magnesium oxide (MgO), titanium dioxide ($TiO_2$), and zinc oxide (ZnO), and the whole top surface of the laser barrier layer is in direct contact with the protective film layer.

2. The method of claim 1, wherein the method further comprises:
laser-cutting the protective film layer at a target position on the protective film layer such that a slit is formed in the protective film layer at the target position, wherein an orthogonal projection of the target position on a plane of the laser barrier layer is located within a range of the laser barrier layer; and
separating a portion of the protective film layer from the display structure by the slit, to expose at least a portion of the lead metal layer.

3. The method of claim 2, wherein the method further comprises: after the separating the portion of the protective film layer from the display structure by the slit, separating the portion of the protective film layer from the display structure completely.

4. The method of claim 2, wherein the laser-cutting the protective film layer at the target position on the protective film layer comprises:
outputting a laser beam to a surface of the protective film layer; and
moving the laser beam along a target trajectory on the surface of the protective film layer, wherein the target position is a position through which the laser beam moves along the target trajectory on the protective film layer.

5. The method of claim 1, wherein a plurality of display structures is prepared on the transparent substrate, and the method further comprises: laser-cutting along an edge of each of the plurality of display structures, to obtain a plurality of display panels.

6. The method of claim 1, wherein in a direction of a first edge of the lead metal layer, a size of the laser barrier layer is less than or equal to a size of the first edge; in a direction of a second edge of the lead metal layer, a size of the laser barrier layer is 50 μm to 200 μm.

7. The method of claim 1, wherein the preparing the display structure further comprises: forming a packaging layer on a surface of the pixel unit array away from the transparent substrate.

8. The method of claim 7, wherein a material of the packaging layer is same as a material of the laser barrier layer.

9. The method of claim 8, wherein in the preparing the display structure on the transparent substrate, the packaging layer and the laser barrier layer are formed by a single patterning process.

\* \* \* \* \*